(12) United States Patent
Jang et al.

(10) Patent No.: US 8,535,973 B2
(45) Date of Patent: Sep. 17, 2013

(54) METHOD FOR PRODUCING NANOPARTICLE/BLOCK COPOLYMER COMPOSITES AND DEVICES CONTAINING THE SAME

(75) Inventors: Eun Joo Jang, Suwon-si (KR); Kook Heon Char, Seoul (KR)

(73) Assignees: Samsung Electronics Co., Ltd. (KR); Seoul National University R&DB Foundation (KR)

( * ) Notice: Subject to any disclaimer, the term of this patent is extended or adjusted under 35 U.S.C. 154(b) by 27 days.

(21) Appl. No.: 12/458,232

(22) Filed: Jul. 6, 2009

(65) Prior Publication Data

US 2010/0148156 A1 Jun. 17, 2010

(30) Foreign Application Priority Data

Dec. 16, 2008 (KR) ........................ 10-2008-0127691

(51) Int. Cl.
*H01L 51/40* (2006.01)
(52) U.S. Cl.
USPC ........ 438/99; 438/104; 257/E51.026; 257/40; 977/788
(58) Field of Classification Search
USPC ...... 257/40, E51.026; 438/99, 104; 977/788
See application file for complete search history.

(56) References Cited

U.S. PATENT DOCUMENTS

| 6,501,091 | B1 | 12/2002 | Bawendi et al. |
| 6,727,065 | B2 | 4/2004 | Weiss et al. |
| 6,989,324 | B2 | 1/2006 | Lee et al. |
| 7,138,468 | B2 * | 11/2006 | McCormick et al. ........... 526/89 |
| 7,718,094 | B2 * | 5/2010 | Alexandridis et al. ........ 252/514 |

FOREIGN PATENT DOCUMENTS

| CN | 1686647 | 10/2005 |
| JP | 2003-147418 | 5/2003 |
| KR | 100837046 | 6/2008 |
| KR | 100842810 | 6/2008 |

* cited by examiner

*Primary Examiner* — Kimberly Rizkallah
*Assistant Examiner* — Caleb Henry
(74) *Attorney, Agent, or Firm* — Cantor Colburn LLP

(57) ABSTRACT

A method for producing nanoparticle/block copolymer composites is provided. The method includes mixing nanoparticles having an organic ligand L and a block copolymer A-b-B having block repeating units A and B with different solubility parameters in a solvent S to form micelles by self-assembly. The solubility parameters of the organic ligand L, the block repeating units A and B of the block copolymer A-b-B and the solvent S satisfy the following inequalities:

$$29 \leq \delta_S - \delta_A \quad (1)$$

$$\delta_S - \delta_B \leq 29 \quad (2)$$

$$|\delta_L - \delta_A| \leq 5 \text{ or } |\delta_L - \delta_B| \leq 5 \quad (3)$$

in which $\delta_S$, $\delta_A$, $\delta_B$ and $\delta_L$ represent the solubility parameters of the solvent S, the block repeating unit A, the block repeating unit B and the ligand L, respectively. According to the method, the inherent electrical, magnetic, optical, chemical and mechanical properties of the nanoparticles can be maintained or improved without the need to modify the surface of the nanoparticles.

19 Claims, 5 Drawing Sheets

METHOD FOR PRODUCING NANOPARTICLE/BLOCK COPOLYMER COMPOSITES AND DEVICES CONTAINING THE SAME

CROSS-REFERENCE TO RELATED APPLICATION

This application claims priority to Korean Patent Application No. 10-2008-0127691, filed on Dec. 16, 2008, and all the benefits accruing therefrom under 35 U.S.C. §119, the contents of which in its entirety are herein incorporated by reference.

BACKGROUND

1. Field

The present disclosure is directed to a method for producing nanoparticle/block copolymer composites. More specifically, the method is directed to the production of nanoparticle/block copolymer composites where inherent electrical, magnetic, optical, chemical, mechanical and other properties of the nanoparticles can be maintained or improved without the need to modify the surface of the nanoparticles.

2. Description of the Related Art

Various types of nanoparticles are known. A quantum dot, also called a "semiconductor nanocrystal," is representative of a semiconductor nanoparticle. A quantum dot is a crystalline material that is a few nanometers in size and contains several hundred to several thousand atoms. Because a quantum dot has a large surface area per unit volume due to its small size, most of the constituent atoms are present on the surface and unexpected characteristics (e.g., quantum confinement) are exhibited. The structural characteristics of the quantum dot give unique electrical, magnetic, optical, chemical and mechanical properties that differ from the constituent materials of the quantum dot.

Quantum dots absorb light from an excitation source to reach an excited state of energy and radiate energy corresponding to the energy band gap. Therefore, quantum dots are considered promising materials that are capable of emitting light in the visible and infrared regions. In addition, quantum dots also absorb light in the spectral regions and permit a flow of electric current. Therefore, quantum dots are considered promising optical materials. Accordingly, quantum dots are currently in the spotlight as materials for next-generation electronic components.

At present, various device technologies associated with the use of quantum dots are being investigated. For example, quantum dots are used as light-emitting materials in the fabrication of electronic devices such as light emitting diodes (LEDs). Further, one or more linking agents and one or more affinity molecules are sequentially linked to quantum dots to construct probes capable of determining the presence of a particular biological substance.

The application fields of quantum dots are still limited because of certain inherent characteristics of quantum dots. Particularly, the application of quantum dots to the biological analysis requires removal of organic ligands present on the surface of the quantum dots and linking various materials such as linking agents and affinity molecules to the surface. This replacement procedure is very complicated and results in a deterioration in the reactivity of the quantum dots.

Thus, there is a need to develop a novel method for producing nanoparticle/block copolymer composites wherein nanoparticles with a uniform size can be supported at desired positions, while at the same time maintaining the reactivity of the nanoparticles. Ideally, the process should be simple without the need for additional processing such as the replacement of organic ligands.

SUMMARY

Disclosed herein is a method for producing nanoparticle/block copolymer composites. The method includes mixing nanoparticles having an organic ligand L and a block copolymer A-b-B having block repeating units A and B with different solubility parameters in a solvent S to form micelles by self-assembly wherein the solubility parameters of the organic ligand L, the block repeating units A and B of the block copolymer A-b-B and the solvent S satisfy the following inequalities:

$$29 \leq \delta_S - \delta_A \tag{1}$$

$$\delta_S - \delta_B \leq 29 \tag{2}$$

$$|\delta_L - \delta_A| \leq 5 \text{ or } |\delta_L - \delta_B| \leq 5 \tag{3}$$

wherein $\delta_S$, $\delta_A$, $\delta_B$ and $\delta_L$ represent the solubility parameters of the solvent S, the block repeating unit A, the block repeating unit B and the ligand L, respectively.

Also disclosed herein is a device that includes nanoparticle/block copolymer composites produced by an exemplary embodiment of the method.

BRIEF DESCRIPTION OF THE DRAWINGS

The exemplary embodiments will be more clearly understood from the following detailed description taken in conjunction with the accompanying drawings, where.

DETAILED DESCRIPTION

Figure 1:
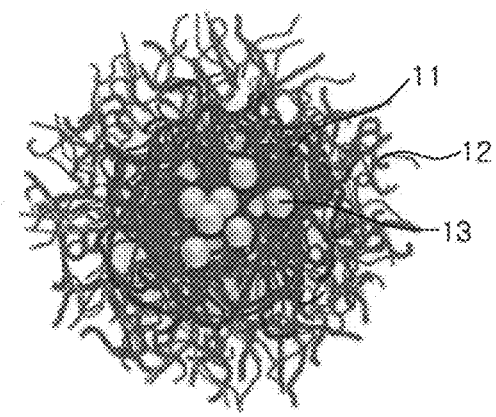
FIGS. 1 and 2 are diagrams illustrating exemplary embodiments of nanoparticle/block copolymer composites.

Exemplary embodiments will now be described in greater detail with reference to the accompanying drawings, in which exemplary and selected embodiments are shown. These exemplary embodiments may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on, the other element or intervening elements may be present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to limit the scope of the claims. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

According to one exemplary embodiment, there is provided a method for producing nanoparticle/block copolymer composites. The method includes mixing nanoparticles having an organic ligand L and a block copolymer A-b-B having block repeating units A and B with different solubility parameters in a solvent S to form micelles by self-assembly wherein the solubility parameters of the organic ligand L, the block repeating units A and B of the block copolymer A-b-B and the solvent S satisfy the following inequalities:

$$29 \leq \delta_S - \delta_A \quad (1)$$

$$\delta_S - \delta_B \leq 29 \quad (2)$$

$$|\delta_L - \delta_A| \leq 5 \text{ or } |\delta_L - \delta_B| \leq 5 \quad (3)$$

wherein $\delta_S$, $\delta_B$ and $\delta_L$ represent the solubility parameters of the solvent S, the block repeating unit A, the block repeating unit B and the ligand L, respectively.

Solubility parameter $\delta$ of a substance is indicative of the degree of aggregation between the constituents of the substance. In order to dissolve a solute in a solvent, the solute must overcome the attractive forces between the solvent molecules to allow the solvent molecules to surround the solute molecules (i.e., salvation). Hildebrand, in Barton, AFM (1991) Handbook of Solubility Parameters and Other Cohesion Parameters, $2^{nd}$ Edition, CRC Press, has suggested that this positive deviation arises due to the difference in cohesive force between the molecules of the respective constituents. According to Hildebrand, the heat of vaporization of a liquid is the amount of heat absorbed when the liquid breaks the intermolecular attractive forces and is changed to a vapor. The heat of vaporization can be defined as a measure of the intermolecular cohesive force of the liquid. The molecular energy per molar volume of the liquid, $\Delta U/V$ (heat of vaporization per unit volume) is called the cohesive energy density (c). From the foregoing, the solubility parameter can be defined by the following equation (by Hildebrand and Scatchard):

$$\delta = c^{0.5} = (\Delta U/V)^{0.5} \quad (4)$$

where c is the cohesive energy density, and $\Delta U/V$ is the heat of vaporization per unit time.

The Gibbs free energy change for the dissolution of a solute in a solvent ($\Delta G_{mix}/RT$, wherein R is the gas constant and T is absolute temperature) can be represented by the Flory-Huggins equation:

$$\Delta G_{mix}/RT = \Phi_s \ln \Phi_s + \Phi_p \ln \Phi_p + \chi_{sp} \Phi_p \Phi_s$$

$$\chi_{sp} = (V_s/RT)(\delta_s - \delta_p)^2 \quad (5)$$

In Equation 5, $\chi_{sp}$ represents the interaction parameter between the solvent and the solute, $V_s$ represents the molar volume of the solvent, $\delta_s$ and $\delta_p$ represent the solubility parameters of the solvent and the solute, respectively, and $\Phi_s$ and $\Phi_p$ represent the volume fractions of the solvent and the solute in the mixture, respectively.

Equation 5 reveals that the miscibility of the solute and the solvent increases as the difference in the solubility parameter between the solute and the solvent decreases, irrespective of the compositions of the solute and the solvent in the mixture. That is, the dissolution of a certain solute in a certain solvent is ensured when the difference in the solubility parameter between the solute and the solvent is small.

In a block copolymer A-b-B having block repeating units A and B with different solubility parameters, one of the block repeating units is highly soluble in a particular solvent (i.e. lyophilic) and tends to be located close to the solvent, and the other block repeating unit is minimally soluble in the solvent (i.e. lyophobic) and tends to aggregate the adjacent lyophobic block repeating units. Due to these different tendencies, the block copolymer A-b-B undergoes self-assembly to form micelles. In each of the micelles, the inner portion formed by the aggregated lyophobic block repeating units is defined herein as a "core", and the outer portion formed by the lyophilic block repeating units is defined herein as a "corona."

Nanoparticles may be located within or on the surface of the micelle of the block copolymer A-b-B depending on the interaction or physical bonding between an organic ligand present on the surface of the nanoparticles and the block repeating unit constituting the core or corona of the micelle. This interaction or physical bonding is determined by the difference in the solubility parameter between the organic ligand and the block repeating unit.

According to an exemplary embodiment of the method, the solubility parameters of the organic ligand L, the block repeating units A and B of the block copolymer A-b-B and the solvent S are determined such that they satisfy the inequalities 1, 2 and 3.

As expressed by Inequality 1, the difference in the solubility parameter between the solvent and the block repeating unit A $(\delta_S-\delta_A)$ is equal to or greater than 29. The larger the difference, the better the micelle formation. The repulsive force between the solvent and the block repeating unit A increases with an increasing difference in the solubility parameter between the solvent and the block repeating unit A, allowing the block repeating unit A to function as a core, and making it easier to form micelles. Therefore, the difference in solubility parameter is limited to the range ($\geqq 29$) as defined above.

As expressed by Inequality 2, the difference in the solubility parameter between the solvent and the block repeating unit B $(\delta_S-\delta_B)$ is equal to or less than 29. The smaller the difference in the solubility parameter between the solvent and the block repeating unit B, the better the micelle formation. The affinity of the block repeating unit B for the solvent increases with a decreasing difference in the solubility parameter between the solvent and the block repeating unit B, which allows the block repeating unit B to function as a corona, making it easier to form micelles. Therefore, the difference in solubility parameter is limited to the range of 5 to 29.

As expressed by Inequality 3, the difference in the solubility parameter between the ligand attached to the surface of the nanoparticles and the block repeating unit A $(\delta_L-\delta_A)$ or B $(\delta_L-\delta_B)$ is not greater than 5. The smaller the difference, the better the micelle formation. When the difference in the solubility parameter between the ligand and the block repeating unit A $(\delta_L-\delta_A)$ is 5 or below, the nanoparticles are present within the micelles to be formed by self-assembly. When the difference in the solubility parameter between the ligand and the block repeating unit B $(\delta_L-\delta_B)$ is 5 or below, the nanoparticles are present on the surface of the micelles to be formed by self-assembly. The difference in the solubility parameter between the ligand and the block repeating unit A or B may be in the range of 0.01 to 5.

The difference in the solubility parameter between the solvent and the ligand $(\delta_S-\delta_L)$ may be greater than or equal to that between the solvent and the block repeating unit A $(\delta_S-\delta_A)$. The difference in the solubility parameter $(\delta_S-\delta_L)$ between the solvent and the ligand $(\delta_S-\delta_L)$ may be 29 or above.

According to an exemplary embodiment of the method, by taking advantage of the difference in the solubility parameters of the organic ligand L present on the surface of the nanoparticles, the solvent S and the block repeating units A and B of the block copolymer A-b-B, the nanoparticles can be supported at selected positions of the block copolymer micelles without the need to modify the surface of the nanoparticles.

Figure 2:
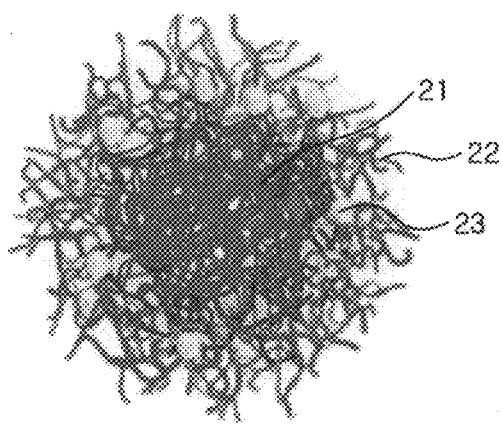

In one exemplary embodiment, one or more types of nanoparticles may be located at desired positions within or on the surface of the nanoparticle/block copolymer composites. The exemplary nanoparticle/block copolymer composites are diagrammatically illustrated in FIGS. 1 and 2. The nanoparticles may be selectively localized within the block copolymer micelles. Alternatively, the nanoparticles may be distributed separately.

Where the nanoparticle/block copolymer composites include luminescent nanoparticles, magnetic nanoparticles and metal nanoparticles, any of these types of nanoparticles may be present in the cores of the block copolymer micelles, or the luminescent nanoparticles may be present on the surface portions (coronas) of the micelles and the magnetic nanoparticles and the metal nanoparticles may be present in the cores of the micelles.

There is no particular limitation with regard to the types of nanoparticles. The nanoparticles may be selected from the group consisting of metal nanoparticles, semiconductor nanoparticles, magnetic nanoparticles, luminescent nanoparticles, and combinations thereof.

In one exemplary embodiment, the nanoparticles may be composed of a material selected from the group consisting of metals, transition metals, metal oxides, transition metal oxides, metal sulfides, transition metal sulfides, Group II-VI compounds, Group III-V compounds, Group IV-VI compounds, Group IV elements and compounds, and combinations thereof.

In one exemplary embodiment, the metals and the transition metals may be selected from the group consisting of Pd, Pt, Ni, Co, Rh, Ir, Fe, Ru, Fe, Au, Ag, Cu, and combinations thereof.

The metal oxides, the transition metal oxides, the metal sulfides and the transition metal sulfides may be those of a metal or transition metal selected from the group consisting of Pd, Pt, Ni, Co, Rh, Ir, Fe, Ru, Fe, Au, Ag, Cu, and combinations thereof.

In one exemplary embodiment, the Group II-VI compounds may be selected from the group consisting of: binary compounds, e.g., CdSe, CdTe, ZnS, ZnSe, ZnTe, ZnO, HgS, HgSe and HgTe; ternary compounds, e.g., CdSeS, CdSeTe, CdSTe, ZnSeS, ZnSeTe, ZnSTe, HgSeS, HgSeTe, HgSTe, HgZnTe, CdZnS, CdZnSe, CdZnTe, CdHgS, CdHgSe, CdHgTe, HgZnS and HgZnSe; and quaternary compounds, e.g., CdZnSeS, CdZnSeTe, CdZnSTe, CdHgSeS, CdHgSeTe, CdHgSTe, HgZnSeS, HgznSeTe and HgZnSTe. In another exemplary embodiment, the Group III-V compounds may be selected from the group consisting of: binary compounds, e.g., GaN, GaP, GaAs, GaSb, AlN, AlP, AlAs, AlSb, InN, InP, InAs and InSb; ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb and GaAlNP; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb. In still another exemplary embodiment, the Group IV-VI compounds may be selected from the group consisting of: binary compounds, e.g., SnS, SnSe, SnTe, PbS, PbSe and PbTe; ternary compounds, e.g., SnSeS, SnSeTe, SnSTe, PbSeS, PbSeTe, PbSTe, SnPbS, SnPbSe and SnPbTe; and quaternary compounds, e.g., SnPbSSe, SnPbSeTe and SnPbSTe. In yet another exemplary embodiment, and the Group IV compounds may be selected from the group consisting of: unary compounds, e.g., Si and Ge; and binary compounds, e.g., SiC and SiGe.

In one exemplary embodiment, the constituent elements of the binary compounds, the ternary compounds or the quaternary compounds may be present at uniform concentrations within particles or may be present or partially present in different concentration distributions within the same particles.

In one exemplary embodiment, the nanoparticles may have a diameter of 1 to 100 nm. The diameter of the nanoparticles may be between 10 and 80 nm.

The nanoparticles may have any known shape. For example, the nanoparticles may be nanospheres, nanotubes, nanowires, nanofibers or nanoplates.

The nanoparticles may be synthesized by generally known processes.

For example, the nanometer-sized quantum dots can be synthesized by a wet chemical process in which particles are grown from a precursor material in an organic solvent. The organic solvent is naturally coordinated to the surface of the quantum dot crystals. That is, the organic solvent serves as a dispersant to control the growth of the crystals.

An organic ligand L is present on the surface of the nanoparticles. Conventionally, organic ligands of nanoparticles are removed and various linking materials are linked to the nanoparticles in order to use the nanoparticles in various applications. In contrast, according to an exemplary embodiment of the method, the organic ligand present on the surface of the nanoparticles remains without any additional processing.

In one exemplary embodiment, the organic ligand L may be a compound selected from the group consisting of substituted and unsubstituted alkanes, substituted and unsubstituted alkenes, substituted and unsubstituted alkynes, substituted and unsubstituted aromatic hydrocarbons and combinations thereof. The weight average molecular weight of the organic ligand L is in the range of 10 to 1,000,000. The weight average molecular weight of the organic ligand L may be in the range of 500 to 1,000,000. The alkanes, alkenes, alkynes and aromatic hydrocarbons may be substituted with at least one group selected from the group consisting of thiol, amine, carboxyl, phosphine, phosphine oxide groups, and combinations thereof. The substituent of the organic ligand remains on the surface of the nanoparticles. The organic ligand L may have a polydispersity index (PDI) of less than 2. The polydispersity index is defined as the ratio of the weight average molecular weight to the number average molecular weight.

In one exemplary embodiment, the block copolymer A-b-B may be selected from the group consisting of di-block copolymers, tri-block copolymers, random block copolymers, graft block copolymers, and combinations thereof.

In one exemplary embodiment, the block copolymer A-b-B may include two or more polymer blocks selected from the group consisting of polystyrene (PS); polyisoprene (PI); polyalkylenes such as polybutadiene (PB) and polyethylene (PE); polyalkylene oxides such as polyethylene oxide (PEO), polypropylene oxide (PPO) and polybutylene oxide (PBO); polyalkyl (meth)acrylates such as polymethyl (meth)acrylate (PMMA); poly(2-vinylpyridine) (P2VP); poly(4-vinylpyridine) (P4VP); polyacrylic acid (PAA); polyalkylacrylic acids such as polymethylacrylic acid (PMA); polydialkylsiloxanes such as polydimethylsiloxane (PDMS); polyacrylamide (PAM); poly(ε-caprolactone) (PCL); polylactic acid (PLA); poly(lactic-co-glycolic acid) (PLGA); and combinations thereof.

Depending on the attractive force between the block repeating units and a change in the volume of the block repeating units, the block copolymer may be designed to have a general molecular shape such as linear, branched or circular. Further, the block copolymer may be dissolved in a solvent whose solubility parameter is substantially similar to that of one of the block repeating units to achieve various micelle structures. Further, the nanoparticle/block copolymer composites can find utility in physiological applications by modifying one of the block repeating units to be hydrophilic.

In one exemplary embodiment, the solvent may be an aqueous or protic solvent selected from the group consisting of water, alcohols having one to ten carbon atoms, and combinations thereof.

In one exemplary embodiment, the block copolymer A-b-B and the nanoparticles having the organic ligand L may be mixed in a weight ratio of 1:0.5-5. The mixed weight ratio of the block copolymer A-b-B and the nanoparticles may be 1:0.5-2.

Figure 10:
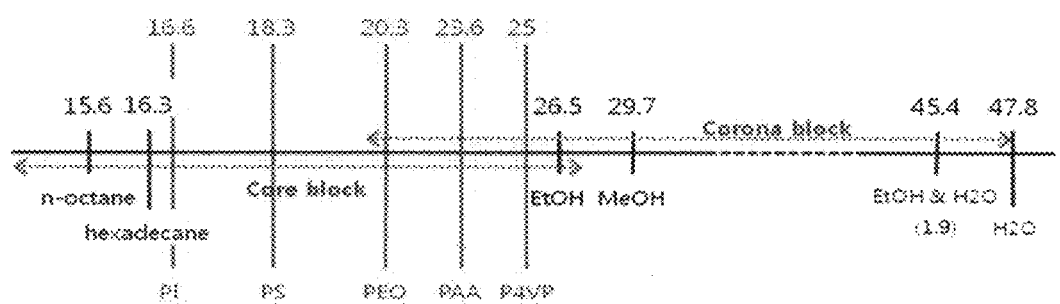
FIG. 10 depicts the solubility parameters of some representative organic ligands, block repeating units A and B of the block copolymer A-b-B and solvents.

The solubility parameters of some representative organic ligands, block repeating units A and B of the block copolymer A-b-B, and solvents are depicted in FIG. 10.

Where the organic ligand present on the surface of the nanoparticles is octanethiol, the block copolymer is polystyrene-block-polyethylene oxide (PS-b-PEO) and the solvent is water, the block copolymer and the nanoparticles aggregate due to the difference in their solubility parameters. In this case, the polystyrene unit, which has a very different solubility parameter than that of the water supports the nanoparticles, which have a solubility parameter that is similar to that of the polystyrene unit, forming cores, and the polyethylene oxide unit, which has a solubility parameter that is substantially similar to that of the water forms coronas free of the nanoparticles. As a result, nanocomposites can be produced in which the nanoparticles are selectively located in the cores. The octanethiol present on the surface of the nanoparticles in the nanocomposites remains unmodified, which maintains the inherent physical properties of the nanoparticles.

In one exemplary embodiment, the method may further include coating the surface of the nanoparticle/block copolymer composites with a metal oxide. In one exemplary embodiment, the metal oxide may be selected from the group consisting of oxides of Si, Ti, Co, Sn, Al, Zn, In, Zr, Ni, Hf, V and combinations thereof.

The metal oxide coating functions as a protective film to protect the surface of the nanoparticle/block copolymer composites. The protective film may further contain a material selected from organic and inorganic colloids and organic polymers in addition to the metal oxide. The protective film may be formed by adsorbing the selected materials on the surface of the nanoparticle/block copolymer composites. Other exemplary methods for forming the protective film on the nanoparticle/block copolymer composites include polymerization, sol-gel reactions, acid-base reactions, and the like.

In sol-gel processes, a metal oxide precursor is hydrolyzed to form a metal oxide. The metal oxide precursor may be selected from the group consisting of triethoxysilane, trimethoxysilane, tributoxysilane, sodium silicate, titanium isopropoxide, titanium butoxide, tin butoxide, sodium stannate, cobalt carbonate, aluminum chloride, zinc chloride, indium chloride, zirconium chloride, nickel chloride, hafnium chloride, vanadium chloride, and combinations thereof.

Optionally, one or more additives selected from surfactants, acid catalysts and base catalysts may be further used during the hydrolysis.

The nanocomposites have a structure in which the highly functional nanoparticles are supported within the block copolymer micelles. Due to this structure, the inherent characteristics of the nanoparticles can be maintained or improved and new characteristics can be imparted to the nanoparticles. Therefore, the nanocomposites can be useful in various fields.

For example, nanocomposites including luminescent nanoparticles supported in the block copolymer achieve improved stability (e.g., luminescence lifetime) of the luminescent nanoparticles while maintaining the luminescence efficiency of the luminescent nanoparticles. In addition, the block copolymer can impart desired characteristics such as solubility and selectivity to the nanocomposites. Therefore, the nanocomposites can also be useful in physiological applications, including bioluminescent display devices. The nanoparticle/block copolymer composites may include two or more types of nanoparticles that emit light of different colors and are separately supported at desired positions within the block copolymer. In this case, the arrangement of the colors from the nanoparticles can be readily controlled by varying the affinity and bonding between the nanoparticles and the polymer.

In accordance with another exemplary embodiment, there is provided a device containing a nanoparticle/block copolymer composite as described herein. The device may be a photoelectronic device or a memory device. The nanoparticle/block copolymer composites may be dispersed in the device. Alternatively, the device may include an organic/inorganic matrix in which the nanoparticle/block copolymer composites are arranged, for example, a bioluminescent display device or a light-emitting diode device. The nanocomposites may also be useful as light-emitting materials for bioluminescent display devices, light-emitting materials for displays (e.g., light-emitting diodes), semiconductor materials for memory devices, packaging materials, and the like.

The nanoparticle/block copolymer composites are particularly suitable for use as luminescent materials of light-emitting diodes ("LEDs").

Figure 3:
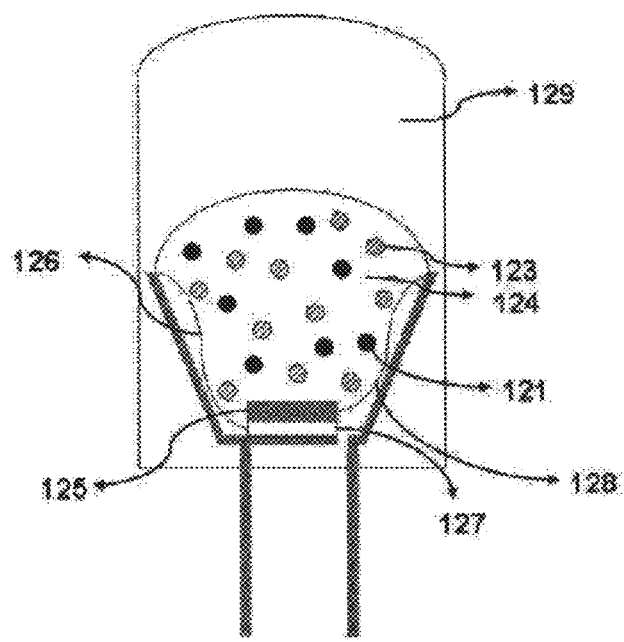
FIG. 3 is a cross-sectional view of a white light-emitting diode including nanoparticle/block copolymer composites produced by an exemplary embodiment of a method.

FIG. 3 is a cross-sectional view of a white light-emitting diode including nanoparticle/block copolymer composites produced as described herein. In the white light-emitting diode, green and red light-emitting materials are excited by light from a blue light-emitting diode (LED) to emit green and red light, respectively. The green light and the red light combine blue light penetrating a light-emitting layer to achieve white light emission. Further, green, red and blue light-emitting materials are excited by light from a UV light-emitting diode (LED) to emit green, red and blue light, respectively, which combine together to achieve white light emission.

As illustrated in FIG. 3, the light-emitting diode includes a blue light-emitting diode chip consisting of a p-type semiconductor 125 and an n-type semiconductor 127 disposed on a substrate, and a mixed light-emitting material layer 129 composed of a transparent resin matrix 124 to cover the blue light-emitting diode chip. The transparent resin matrix 124 contains a green light-emitting material 121 and a red light-emitting material 123. The p-type semiconductor 125 is connected to an electrode through a wire 126 and the n-type semiconductor 127 is connected to another electrode through a wire 128.

Generally, light-emitting material layers may be designed to have various structures. For example, the light-emitting material layer 129 may be composed of a mixture of red and green light-emitting materials. A light-emitting material layer of a white light-emitting diode is composed of an inorganic phosphor and semiconductor nanocrystals. For example, the phosphor mixture layer 129 may be composed of a green inorganic phosphor and red light-emitting semiconductor nanocrystals. The phosphor mixture layer 129 may be composed of a red inorganic phosphor and green light-emitting semiconductor nanocrystals. Alternatively, the phosphor mixture layer 129 may be composed of green and red inorganic phosphors and red or green light-emitting semiconductor nanocrystals. Alternatively, the phosphor mixture layer 129 may be composed of an inorganic phosphor and two different types of semiconductor nanocrystals. Alternatively, the phosphor mixture layer 129 may be composed of two different inorganic phosphors and two different types of semiconductor nanocrystals.

When the nanocrystals are nanoparticle/block copolymer composites as described herein, the electrical, magnetic, optical, chemical and mechanical properties of the nanocrystals can be maintained or improved. The semiconductor nanocrystals can be used in various applications because of their controllable emission wavelength and good color purity. The semiconductor nanocrystals may be used as light-emitting materials of a light-emitting diode to achieve improved photostability.

A more detailed description of exemplary embodiments will be described with reference to the following examples. However, these examples are given merely for the purpose of illustration and are not to be construed as limiting the scope of the claims.

Details that are not included herein will be readily technically recognized and appreciated by those skilled in the art, and thus their description is omitted.

EXAMPLES

Example 1

0.5 mg of PS-b-PEO as a block copolymer and 0.5 mg of CdSe/CdS/ZnS nanoparticles (diameter=5 nm) having oleic acid as an organic ligand are dissolved in 1 ml of chloroform ($CHCl_3$).

After 20 ml of tetrahydrofuran (THF) is added to the solution, the chloroform is completely removed by evaporation with stirring until the final volume reaches 0.5 ml.

Figure 4:
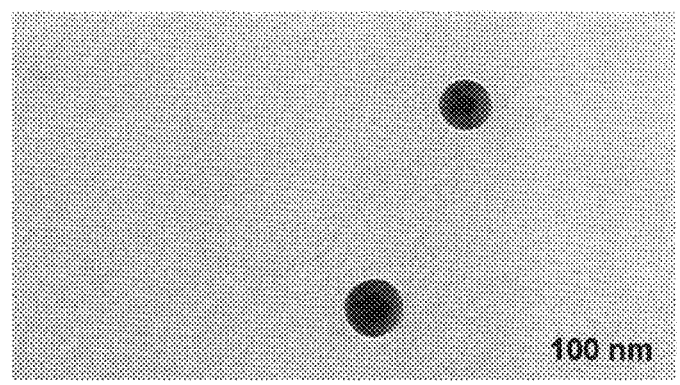
FIG. 4 is a transmission electron microscopy (TEM) image of nanoparticle/block copolymer composites produced in Example 1 in which nanoparticles are located in cores of block copolymer micelles.

The resulting solution is stirred for 3 hours while 5 ml of distilled water is slowly added, to obtain nanoparticle/block copolymer composites. A transmission electron microscopy (TEM) image of the nanoparticle/block copolymer composites is shown in FIG. 4.

The optical properties of the nanoparticle/block copolymer (QD/BCM) composites and the CdSe/CdS/ZnS nanoparticles (QD) after storage in distilled water are measured by photoluminescence spectroscopy. The obtained spectra are shown in FIG. 5.

Figure 5:
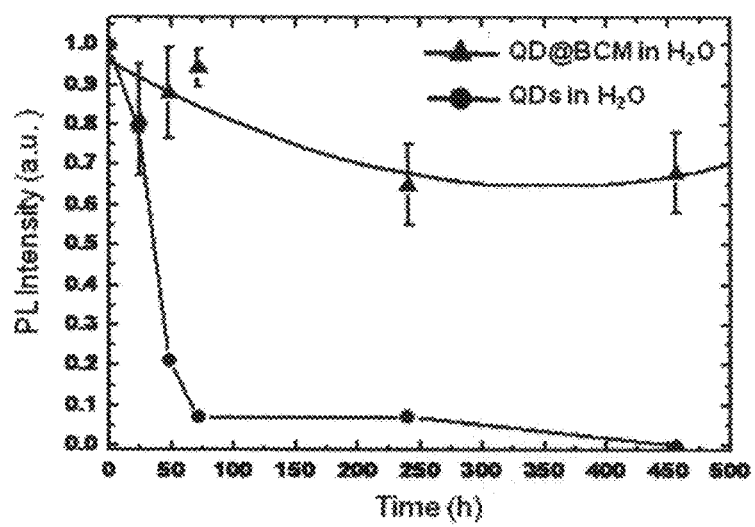
FIG. 5 is a graph comparing the optical properties of nanoparticle/block copolymer composites produced in Example 1 in which nanoparticles are located in cores of block copolymer micelles, with the optical properties of CdSe/CdS/ZnS nanoparticles after storage in distilled water.

Referring to FIG. 5, the stability of the nanoparticles (quantum dots) supported within the block copolymer micelles of the nanoparticle/block copolymer composites is maintained over time, compared to that of the nanoparticles dispersed in distilled water.

Figure 6:
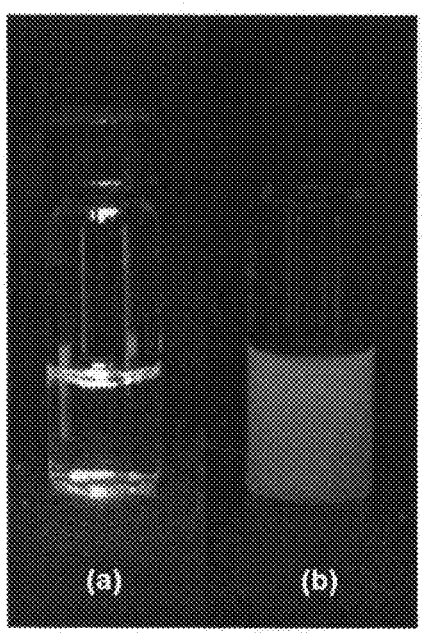
FIG. 6 shows (a) an image of CdSe/CdS/ZnS nanoparticles (diameter=5 nm) in distilled water and (b) an image of nanoparticle/block copolymer composites produced in Example 1 upon UV irradiation.

The nanoparticle/block copolymer composites and the CdSe/CdS/ZnS nanoparticles (diameter=5 nm) in distilled water are further irradiated with UV (365 nm). The respective images are shown in FIG. 6.

The images show that the nanoparticles (quantum dots) supported within the block copolymer micelles of the nanoparticle/block copolymer composites stably emit light, compared to the nanoparticles dispersed in distilled water.

Comparative Example 1

Nanoparticle/block copolymer composites are produced in the same manner as in Example 1, except that when 0.5 ml of the solution containing the block copolymer (PS-b-PEO), the CdSe/CdS/ZnS nanoparticles (diameter=5 nm) and tetrahydrofuran remains, ethanol is added instead of distilled water.

Figure 7:
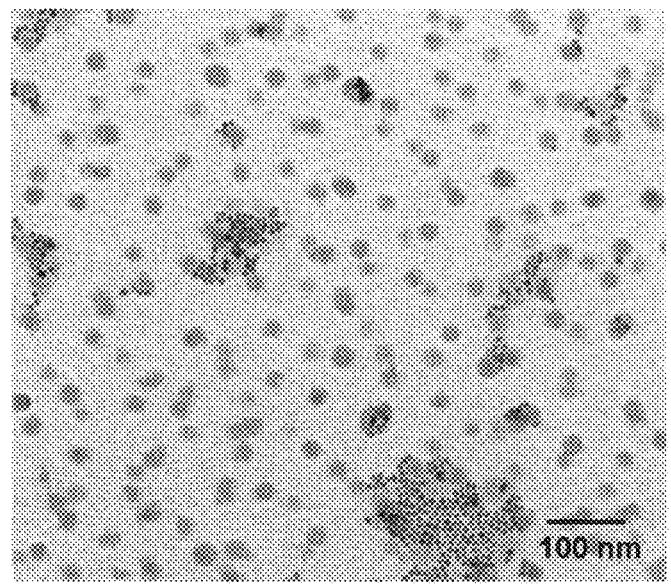
FIG. 7 is a transmission electron microscopy image of nanoparticle/block copolymer composites produced in Comparative Example 1 in which nanoparticles are not bound to block copolymer micelles.

An electron microscopy image of the nanoparticle/block copolymer composites is shown in FIG. 7.

Example 2

0.5 mg of PS-b-PEO as a block copolymer, 0.5 mg of CdSe/CdS/ZnS nanoparticles (diameter=5 nm) having octanethiol as an organic ligand and 0.5 mg of $Fe_2O_3$ are dissolved in 1 ml of chloroform ($CHCl_3$).

After 20 ml of tetrahydrofuran (THF) is added to the solution, the chloroform is completely removed by evaporation with stirring until the final volume reaches 0.5 ml.

Figure 8:
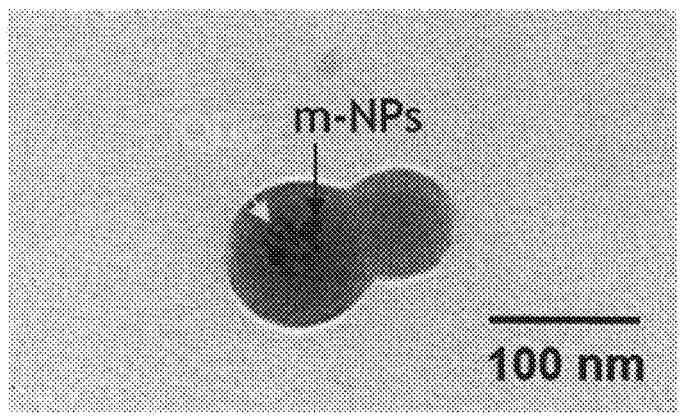
FIG. 8 is a transmission electron microscopy image of nanoparticle/block copolymer composites produced in Example 2 in which both semiconductor nanoparticles and magnetic nanoparticles are located in cores of block copolymer micelles.

The resulting solution is stirred for 3 hours while 5 ml of distilled water is slowly added to obtain nanoparticle/block copolymer composites. An electron microscopy image of the nanoparticle/block copolymer composites is shown in FIG. 8.

Example 3

Hydrochloric acid is added to the solution prepared in Example 1, which contains the block copolymer (PS-b-PEO), the CdSe/CdS/ZnS nanoparticles (diameter=5 nm) and tetrahydrofuran, to obtain a pH of 4.

Next, 500 µl of tetraethylorthosilicate (TEOS) as a silica precursor is added to 1 ml of the pH 4 solution. The mixture is stirred for 48 hours.

After stirring, ethanol is added to the mixture and unreacted silica precursor is removed using a centrifuge, yielding nanoparticle/block copolymer composites having silica protective films on the surfaces thereof. An electron microscopy image of the nanoparticle/block copolymer composites is shown in FIG. 9.

Figure 9:
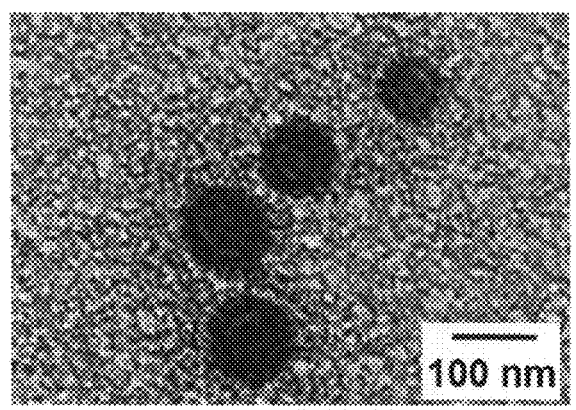
FIG. 9 is a transmission electron microscopy image of nanoparticle/block copolymer composites produced in Example 3 in which nanoparticles are located in cores of block copolymer micelles and having silica protective films on the surfaces thereof.

The images of FIGS. 4, 8 and 9 show that the different types of nanoparticles are separately supported at desired positions within the block copolymers of the respective nanoparticle/block copolymer composites. In contrast, FIG. 7 shows that the nanoparticles are separated from the block copolymer of the nanoparticle/block copolymer composites produced in Comparative Example 1 and the nanoparticles are not supported in the block copolymer.

In conclusion, the inherent characteristics of the nanoparticles in the respective nanoparticle/block copolymer composites produced in Examples 1, 2 and 3 are maintained or improved without any surface modification of the nanoparticles, and new characteristics are imparted to the nanoparticles. Therefore, the nanoparticle/block copolymer composites are expected to be useful in various fields.

Although exemplary embodiments have been described herein with reference to the foregoing preferred embodiments, those skilled in the art will appreciate that various modifications and changes are possible without departing from the spirit of the invention as disclosed in the accompanying claims. Therefore, it is to be understood that such modifications and changes are encompassed within the scope of the claims.

As is apparent from the forgoing, according to an exemplary embodiment of the method, the nanoparticles can be supported at selected positions of the block copolymer micelles by taking advantage of the difference in the solubility parameters of the solvent S, the block repeating units A and B of the block copolymer A-b-B and the organic ligand L. In addition, nanoparticle/block copolymer composites with uniform particle size can be produced by the disclosed method. Based on these advantages, electrical, magnetic, optical, chemical, mechanical and other properties inherent to the highly functional nanoparticles can be well maintained or improved without requiring additional processing for surface modification of the nanoparticles. Therefore, the nanoparticle/block copolymer composites are useful as light-emitting materials for bioluminescent display devices, light-emitting materials for displays (e.g., light-emitting diodes), semiconductor materials for memory devices, packaging materials, and the like applications.

The nanoparticle/block copolymer composites are particularly suitable for use in photoelectronic devices. The devices described above can be produced using any known method by incorporating the disclosed nanoparticle/block copolymer into the device.

What is claimed is:

1. A method for producing nanoparticle/block copolymer composites, the method comprising:
   mixing nanoparticles having an organic ligand L and a block copolymer A-b-B having block repeating units A and B with different solubility parameters in a solvent S to form micelles by self-assembly to produce the nanoparticle/block copolymer composite,
   wherein the solubility parameters of the organic ligand L, the block repeating units A and B of the block copolymer A-b-B and the solvent S satisfy the following inequalities:

$$29 \leq \delta_S - \delta_A \quad (1)$$

$$\delta_S - \delta_B \leq 29 \quad (2)$$

$$|\delta_L - \delta_A| \leq 5 \text{ or } |\delta_L - \delta_B| \leq 5 \quad (3)$$

$$29 \leq \delta_S - \delta_L \quad (6)$$

wherein $\delta_S$, $\delta_A$, $\delta_B$ and $\delta_L$ represent the solubility parameters of the solvent S, the block repeating unit A, the block repeating unit B and the ligand L, respectively,
   wherein the organic ligand is present on the surface of the nanoparticle in the micelle,
   wherein the nanoparticles have a diameter of about 1 nanometer to about 100 nanometers, and
   wherein the micelle comprises the nanoparticle, the organic ligand disposed on the surface of the nanoparticle, and the block copolymer.

2. The method of claim 1, wherein the nanoparticles are present within or on the surface of the micelles.

3. The method of claim 1, further comprising coating the surface of the nanoparticle/block copolymer composites with a metal oxide.

4. The method of claim 3, wherein the metal oxide is selected from the group consisting of oxides of Si, Ti, Co, Sn, Al, Zn, In, Zr, Ni, Hf, V and combinations thereof.

5. The method of claim 1, wherein the organic ligand L is a compound selected from the group consisting of substituted and unsubstituted alkanes, substituted and unsubstituted alkenes, substituted and unsubstituted alkynes, substituted and unsubstituted aromatic hydrocarbons and combinations thereof, wherein the weight average molecular weight of the organic ligand is about 10 to about 1,000,000.

6. The method of claim 1, wherein the nanoparticles comprise a material selected from the group consisting of metals, transition metals, metal oxides, transition metal oxides, metal sulfides, transition metal sulfides, Group II-VI compounds, Group III-V compounds, Group IV-VI compounds, Group IV elements and compounds, and combinations thereof.

7. The method of claim 6, wherein the nanoparticles comprise the metals or the transition metals and wherein the metals and the transition metals are selected from the group consisting of Pd, Pt, Ni, Co, Rh, Ir, Fe, Ru, Fe, Au, Ag, Cu, and combinations thereof.

8. The method of claim 6, wherein the nanoparticles comprise the group II-VI compounds, the group III-V compounds, the group IV-VI compounds, or the group IV elements and compounds and wherein:

the Group II-VI compounds are selected from the group consisting of the binary compounds CdSe, CdTe, ZnS, ZnSe, ZnTe, ZnO, HgS, HgSe, HgTe and mixtures thereof; the ternary compounds CdSeS, CdSeTe, CdSTe, ZnSeS, ZnSeTe, ZnSTe, HgSeS, HgSeTe, HgSTe, HgZnTe, CdZnS, CdZnSe, CdZnTe, CdHgS, CdHgSe, CdHgTe, HgZnS, HgZnSe and mixtures thereof; and the quaternary compounds CdZnSeS, CdZnSeTe, CdZnSTe, CdHgSeS, CdHgSeTe, CdHgSTe, HgZnSeS, HgZnSeTe, HgZnSTe and mixtures thereof;

the Group III-V compounds are selected from the group consisting of the binary compounds GaN, GaP, GaAs, GaSb, AlN, AlP, AlAs, AlSb, InN, InP, InAs, InSb and mixtures thereof; the ternary compounds GaNP, GaNAs, GaNSb, GaPAs, GaPSb, AlNP, AlNAs, AlNSb, AlPAs, AlPSb, InNP, InNAs, InNSb, InPAs, InPSb, GaAlNP and mixtures thereof; and the quaternary compounds GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof;

the Group IV-VI compounds are selected from the group consisting of the binary compounds SnS, SnSe, SnTe, PbS, PbSe, PbTe and mixtures thereof; the ternary compounds SnSeS, SnSeTe, SnSTe, PbSeS, PbSeTe, PbSTe, SnPbS, SnPbSe, SnPbTe and mixtures thereof; and the quaternary compounds SnPbSSe, SnPbSeTe, SnPbSTe and mixtures thereof; and the Group IV compounds are selected from the group consisting of Si, Ge and a mixture thereof; and the binary compounds SiC, SiGe and a mixture thereof.

9. The method of claim 8, wherein the constituent elements of the binary compounds, the ternary compounds or the quaternary compounds are present in uniform concentrations within particles or are fully or partially divided in different concentration distributions within the same particles.

10. The method of claim 1, wherein the block copolymer A-b-B is selected from the group consisting of di-block copolymers, tri-block copolymers, random block copolymers, graft block copolymers, and combinations thereof.

11. The method of claim 1, wherein the block copolymer A-b-B includes two or more polymers selected from the group consisting of polystyrene (PS), poly-isoprene (PI), polyalkylene, polyalkylene oxide, polyalkyl (meth)acrylate, poly(2-vinylpyridine) (P2VP), poly(4-vinylpyridine) (P4VP), polyacrylic acid (PAA), polyalkylacrylic acid, polydialkylsiloxane, polyacrylamide (PAM), poly(ε-caprolactone) (PCL), polylactic acid (PLA), poly(lactic-co-glycolic acid) (PLGA), and combinations thereof wherein alkylene and alkyl represent $C_1$-$C_{20}$ alkylene and $C_1$-$C_{20}$ alkyl, respectively.

12. The method of claim 1, wherein the solvent S is an aqueous solvent selected from the group consisting of water, alcohols having about one to about ten carbon atoms, and combinations thereof.

13. The method of claim 1, wherein the block copolymer A-b-B and the nanoparticles having the neutral organic ligand L are mixed in a weight ratio ranging from about 1:0.5 to about 1:5.

14. A device comprising nanoparticle/block copolymer composites produced by the method of claim 1.

15. The device of claim 14, wherein the device is a photoelectronic device.

16. The device of claim 14, wherein the device is a bioluminescent display device.

17. The device of claim 14, wherein the device is a light-emitting diode.

18. The device of claim 14, wherein the device is a semiconductor for a memory device.

19. The device of claim 14, wherein the device is a semiconductor material for a packaging material.

* * * * *